United States Patent
Asano

(10) Patent No.: US 8,023,545 B2
(45) Date of Patent: Sep. 20, 2011

(54) SEMICONDUCTOR LIGHT EMITTING DEVICE

(75) Inventor: Hideki Asano, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 214 days.

(21) Appl. No.: 12/329,738

(22) Filed: Dec. 8, 2008

(65) Prior Publication Data

US 2009/0154515 A1    Jun. 18, 2009

(30) Foreign Application Priority Data

Dec. 12, 2007  (JP) .................................. 2007-320457

(51) Int. Cl.
 *H01S 5/00* (2006.01)
(52) U.S. Cl. ................. 372/45.011; 372/45.01
(58) Field of Classification Search ............. 372/45.011, 372/43.01, 45.01
See application file for complete search history.

(56) References Cited

U.S. PATENT DOCUMENTS

| 5,331,656 A | 7/1994 | Tanaka |
| 5,383,214 A | 1/1995 | Kidoguchi et al. |
| 6,285,695 B1 | 9/2001 | Asano et al. |
| 2001/0017875 A1 * | 8/2001 | Fukunaga et al. ............... 372/45 |

FOREIGN PATENT DOCUMENTS

| JP | 5-21894 A | 1/1993 |
| JP | 5-21902 A | 1/1993 |
| JP | 5-275800 A | 10/1993 |
| JP | 6-77587 A | 3/1994 |

OTHER PUBLICATIONS

A. Ihara, "Point defect reaction in (Al)GaInP STQW lasers enhanced by laser operation", Physica B, 1999, pp. 1050-1053, vols. 273-274.

* cited by examiner

*Primary Examiner* — Armando Rodriguez
(74) *Attorney, Agent, or Firm* — Sughrue Mion, PLLC

(57) ABSTRACT

In a semiconductor light emitting device having a conductive semiconductor substrate on which at least the following layers are stacked in the order listed below: a first clad layer; an active layer which includes at least one highly strained quantum well layer having a compressive strain amount of not less than 1% with respect to the conductive semiconductor substrate; and a second clad layer, a strain buffer layer adjacently formed on the active layer and includes a layer having a compressive strain amount not greater than the strain amount of the active layer is further provided.

10 Claims, 5 Drawing Sheets

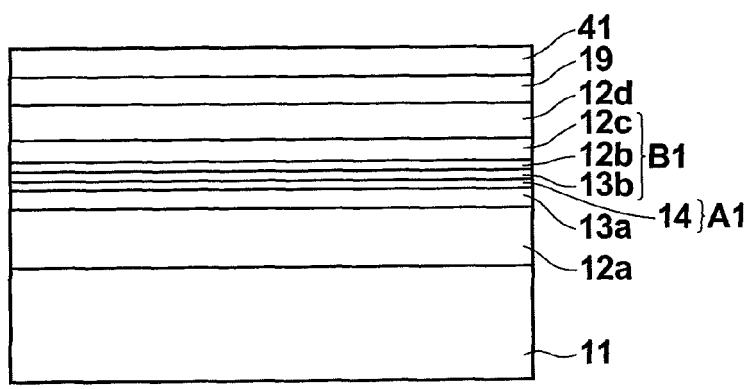
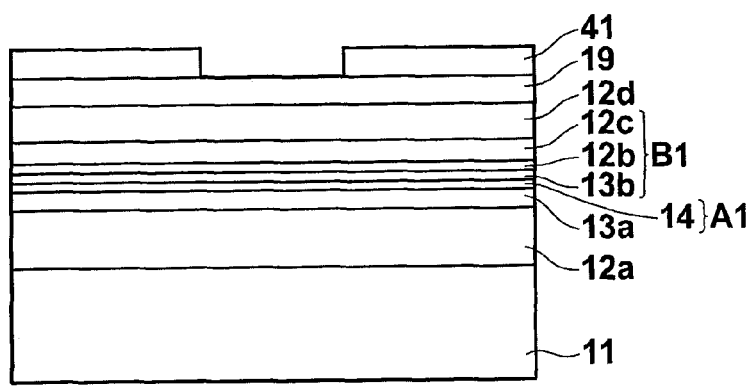
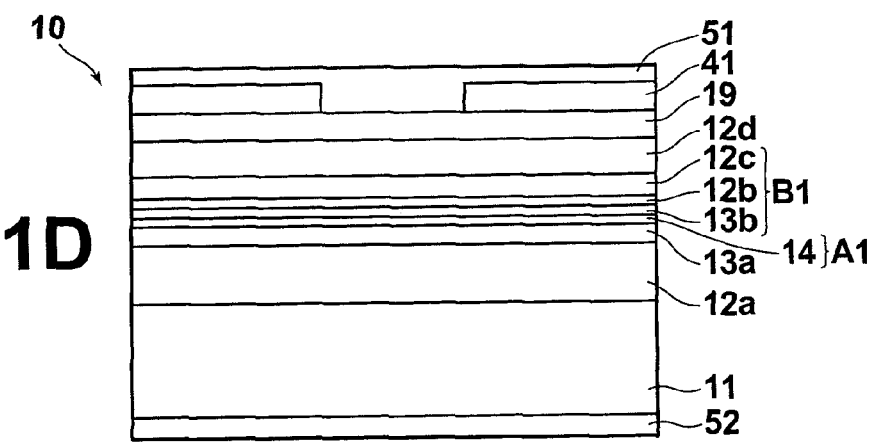

SEMICONDUCTOR LIGHT EMITTING DEVICE

BACKGROUND OF THE INVENTION

1. Field of the Invention

The present invention relates to a semiconductor light emitting device, and more particularly to a semiconductor light emitting device having an active layer which includes a highly strained quantum well layer with a compressive strain amount not less than 1%.

2. Description of the Related Art

Semiconductor lasers in the wavelength range of 1 μm have a layer structure which includes an n-type clad layer, a barrier layer, an InGaAs strained quantum well layer, a barrier layer, and p-type clad layer on an n-GaAs substrate as described, for example, in Japanese Unexamined Patent Publication Nos. 5 (1993)-021902, 5 (1993)-275800, and 6 (1994)-077587.

In the mean time, Semiconductor lasers in the wavelength range of 680 nm have a layer structure which includes an n-AlGaInP clad layer, an ALGaInP barrier layer, a GaInP strained quantum well layer, an AlGaInP barrier layer, and p-AlGaInP clad layer on an n-GaAs substrate as described, for example, in Japanese Unexamined Patent Publication No. 5 (1993)-021894, U.S. Pat. No. 5,331,656, and U.S. Pat. No. 5,383,214.

These semiconductor lasers use a strained quantum well layer, which has a compressive strain amount with respect to the substrate, in the active layer, so that crystals adjacent to the active layer become fragile when energized, which poses a problem of a short operating life when operated with a high output power. In particular, when the compressive strain amount exceeds 1%, the reduction in the operating life is significant and a solution for the problem is demanded.

One approach is proposed for solving the problem in which the stress of strain in the active layer is reduced by disposing a low compressible strain barrier layer or a stretchable tension strain barrier layer next to the active layer, thereby improving the crystal quality. For example, U.S. Pat. No. 6,285,695 discloses a patented invention by the inventor of the present invention in which, in a semiconductor light emitting device having an active layer with a compressive strain amount of about 1%, a tension strain barrier layer is disposed on each side of the active layer in order to improve the reliability.

Generally, however, further improvement in the durability and reliability under high output oscillation is demanded, and in order to meet the demand, it is necessary to investigate the causes of reliability degradation in semiconductor light emitting devices from wider perspectives and to provide measures for eliminating the causes.

A non-patent document A. Ihara et al., "Point defect reaction in (Al)GaInP STQW lasers enhanced by laser operation", Physica B: Condensed Matter, 1999, Vols. 273-274, pp. 1050-1053 describes that where the crystal quality of a clad layer adjacently formed on an active layer is low, the crystal defects spread from the clad layer into the active layer, leading to degradation in the durability and reliability of the semiconductor light emitting device. That is, in order to improve the durability and reliability of a semiconductor light emitting device, it is necessary to optimize not only the crystal state (crystal structure, crystal quality, crystal strength, amount of strain, etc.) of the active layer having a quantum well layer and a barrier layer but also the crystal state of the layer adjacently formed on the active layer.

SUMMARY OF THE INVENTION

The present invention has been developed in view of the circumstances described above, and it is an object of the present invention to provide a semiconductor light emitting device having higher durability and reliability in comparison with conventional devices.

In an effort of achieving the object described above, the inventor of the present invention has noticed and paid attention to the fact that where a layer adjacently formed on an active layer is fabricated so as to have a compressive strain according to the strain of the active layer, the crystal quality of the layer adjacently formed on the active layer is improved, whereby the present invention has been accomplished.

That is, a semiconductor light emitting device according to the present invention is a device including a conductive semiconductor substrate on which at least the following layers are stacked in the order listed below: a first clad layer; an active layer which includes at least one highly strained quantum well layer having a compressive strain amount not less than 1% with respect to the conductive semiconductor substrate; and a second clad layer, wherein the apparatus further includes a strain buffer layer adjacently formed on the active layer and includes a layer having a compressive strain amount not greater than the strain amount of the active layer.

Here, the referent of "compressive strain amount" means, when a layer is formed on a substrate, which has a larger lattice constant than that of the substrate, the ratio of the difference between the lattice constants of the layer and substrate to the lattice constant of the substrate. Where the lattice constants of the layer and substrate are assumed to be $a_{lay}$ and $a_{sub}$, the compressive strain amount $\Delta$ of the layer is given as $\Delta=(a_{lay}-a_{sub})/a_{sub}\times100\%$. Note that positive $\Delta$ values represent compressive strain amounts and negative $\Delta$ values represent tensile strain amounts.

The referent of "highly strained quantum well layer" means a quantum well layer having a compressive strain amount not less than 1% with respect to the conductive semiconductor substrate. When simply describing a quantum well layer having a certain compressive strain amount regardless of the amount, the term "strained quantum well layer" is used.

Further, the referent of "active layer" means a layer that includes at least one highly strained quantum well layer and has a quantum well structure in which injected electrons and holes are recombined and light having a wavelength according to the band gap of the strained quantum well layer is generated. The active layer may have a quantum well structure obtained by alternately stacking strained quantum well layers and barrier layers as required. In the present invention, however, a barrier layer adjacent to the strain buffer layer and has a compressive strain amount not greater than the strain amount of the active layer is included in the strain buffer layer.

Still further, the referent of "strain buffer layer" means a layer adjacently formed on the active layer and the target for improving the crystal quality in order to prevent crystal defects from spreading into the active layer. As described above, the strain buffer layer includes a layer having a compressive strain amount not greater than the strain amount of the active layer.

The referent of "strain amount of the active layer" means a value representative of the strain amount of the active layer. That is, where the active layer is formed of one layer, it means the strain amount of the layer, and where the active layer is formed of a plurality of layers, it means the largest strain amount among those of the layers.

Preferably, in the semiconductor light emitting device according to the present invention, sum S of the product of the compressive strain amount and layer thickness of each layer included in the strain buffer layer represented by Formula (1) below satisfies Formula (2) below.

$$S=\Sigma(\Delta i \times Ti) \quad (1)$$

$$0.2\% \cdot \mu m \geq S \geq 0.02\% \cdot \mu m \quad (2)$$

(where, $\Delta i$ and $Ti$ are the compressive strain amount (%) and layer thickness ($\mu m$) of $i^{th}$ layer of the strain buffer layer from the active layer side, and $\Sigma$ means to sum up the product in each layer included in the strain buffer layer.)

Further, the compressive strain amount of each layer included in the strain buffer layer satisfies Formula (3) below.

$$\Delta 1 \geq \Delta 2 \geq \cdots \geq \Delta i \geq \cdots \geq \Delta n \quad (3)$$

(where, $\Delta i$ is the compressive strain amount of $i^{th}$ layer of the strain buffer layer from the active layer side, and n is the total number of layers included in the strain buffer layer.)

Preferably, the layer thickness of each layer included in the strain buffer layer is in the range from 0.02 to 1 μm, and the product of the compressive strain amount and layer thickness of each layer included in the strain buffer layer is not less than 0.01%·μm.

Preferably, the strain buffer layer includes at least one layer selected from the group consisting of a barrier layer, a light guide layer, and the second clad layer.

Preferably, the first clad layer and second clad layer are made of InGaP, and the strained quantum well layer is made of InGaAs. Alternatively, the first clad layer and second clad layer are made of AlGaInP, and the strained quantum well layer is made of InGaP.

The semiconductor light emitting device according to the present invention includes a strain buffer layer adjacently formed on the active layer and includes a layer having a compressive strain amount not greater than the strain amount of the active layer. This reduces the misfits between the active layer and adjacent layer on the active layer in comparison with a conventional method in which a layer lattice matched with the substrate is adjacently formed on the active layer having a strain amount, and the crystal quality of the adjacent layer on the active layer is improved. Therefore, spreading of crystal defects into the active layer arising from the crystal defects in the adjacent layer on the active layer is reduced, whereby the durability and reliability of the semiconductor light emitting device may be improved.

BRIEF DESCRIPTION OF THE DRAWINGS

FIG. 1A is a cross-sectional view of a semiconductor light emitting device according to a first embodiment, illustrating a manufacturing process thereof (part 1).

FIG. 1B is a cross-sectional view of the semiconductor light emitting device according to the first embodiment, illustrating the manufacturing process thereof (part 2).

FIG. 1C is a cross-sectional view of the semiconductor light emitting device according to the first embodiment, illustrating the manufacturing process thereof (part 3).

FIG. 1D is a cross-sectional view of the semiconductor light emitting device according to the first embodiment.

DESCRIPTION OF THE PREFERRED EMBODIMENTS

Figure 2A:
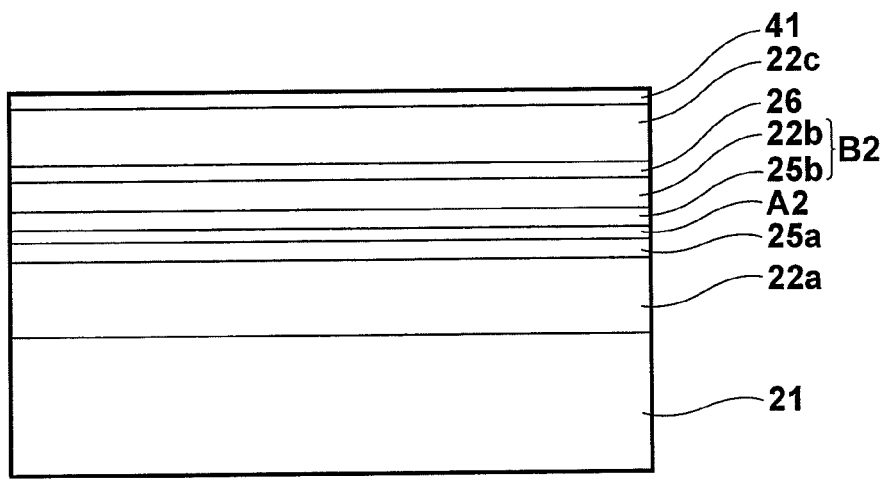
FIG. 2A is a cross-sectional view of a semiconductor light emitting device according to a second embodiment, illustrating a manufacturing process thereof (part 1).
Figure 2B:
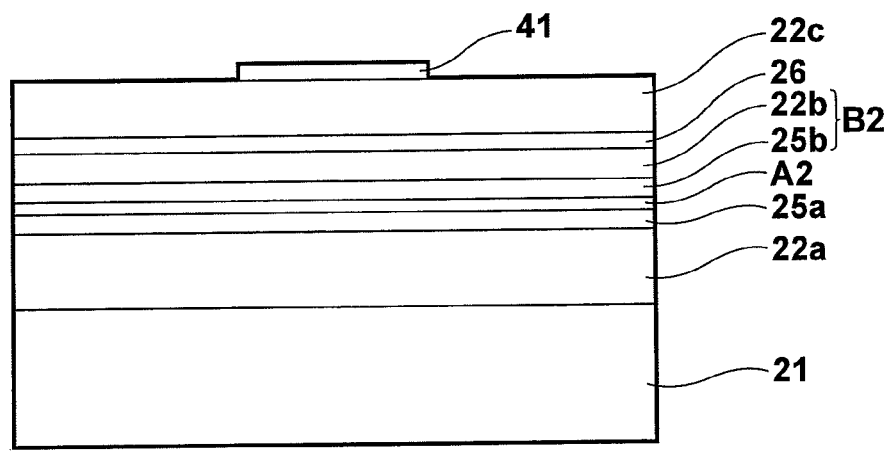
FIG. 2B is a cross-sectional view of the semiconductor light emitting device according to the second embodiment, illustrating the manufacturing process thereof (part 2).
Figure 2C:
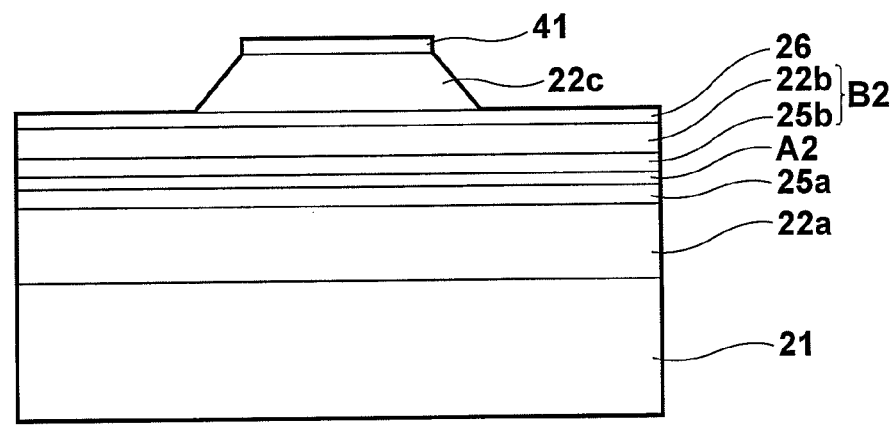
FIG. 2C is a cross-sectional view of the semiconductor light emitting device according to the second embodiment, illustrating the manufacturing process thereof (part 3).

Hereinafter, exemplary embodiments of the present invention will be described with reference to the accompanying drawings. It will be appreciated, however, that these embodiments are given by way of example only, and are not meat to limit the scope of the present invention in any way.

First Embodiment

FIGS. 1A to 1D are schematic cross-sectional views of a semiconductor light emitting device according to a first embodiment, illustrating a manufacturing process thereof. Hereinafter, the structure and manufacturing method of semiconductor light emitting device 10 (FIG. 1D) will be described in detail with reference to the drawings.

Semiconductor light emitting device 10 (FIG. 1D) according to the present embodiment is manufactured in the following manner. First, the following layers are sequentially formed on n-GaAs substrate 11 (FIG. 1A) by organometallic vapor phase epitaxy: n-InGaP first clad layer 12a (lattice matched with substrate 11, layer thickness of 1.5 μm); n- or i-InGaAsP first barrier layer 13a (lattice matched with substrate 11, layer thickness of 0.1 μm); InGaAs highly strained quantum well layer 14 (compressive strain amount of 2.1%, layer thickness of 0.04 μm); i-InGaAsP second barrier layer 13b (compressive strain amount of 1.0%, layer thickness of 0.02 μm); p-InGaP second clad layer 12b (compressive strain amount of 0.5%, layer thickness of 0.04 μm); p-InGaP third clad layer 12c (compressive strain amount of 0.2%, layer thickness of 0.5 μm); p-InGaP fourth clad layer 12d (lattice matched with substrate 11, layer thickness of 1.3 μm); and p-GaAs contact layer 19 (layer thickness of 0.2 μm). Then, SiO$_2$ insulation layer 41 (layer thickness of 0.2 μm) is formed on contact layer 19 (FIG. 1B) and a portion of insulation layer 41 is selectively removed by patterning (FIG. 1C). Thereafter, p-type electrode layer 51 is formed so as to cover insulation layer 41 and the exposed portion of contact layer 19, and n-type electrode layer 52 is formed on the rear surface of substrate 11 after grinding the surface (FIG. 1D).

Substrate 11 is an n-type conductive semiconductor substrate, but a p-type conductive semiconductor substrate may also be used and semiconductor light emitting device 10 may be grown from a p-type semiconductor layer.

Molecular beam epitaxy with a solid or a gas as the source or the like may be used for forming each layer, other than the organometallic vapor phase epitaxy.

Materials of each layer may be properly selected as required, and are not specifically limited to those described above. It is preferable, however, that first clad layer 12a and second clad layer 12b be made of InGaP, and the highly strained quantum well layer (or strained quantum well layer) be made of InGaAs. Alternatively, it is preferable that first clad layer 12a and second clad layer 12b be made of AlGaInP, and the highly strained quantum well layer (or strained quantum well layer) be made of InGaP.

The compressive strain amount and layer thickness of each layer are not necessary limited to the values described above. The strain amount of each layer is controlled by controlling the composition ratio of the materials forming the layer. For example, in $In_{x1}Ga_{1-x1}As$ highly strained quantum well layer 14, it is only necessary to set the value of x1 to 0.3 in order to obtain a compressive strain amount of 2.1%. In a $p-In_{x2}Ga_{1-x2}P$ clad layer, in order to obtain a compressive strain amount of, for example, 1.0%, 0.5%, or 0.2%, it is only necessary to set the value of x2 to 0.62, 0.55, or 0.51, and in order to cause the clad layer to be lattice-matched with substrate 11, it is only necessary to set the value of x2 to 0.49.

Preferably, however, the compressive strain amount of highly strained quantum well layer 14 is in the range from 1.0 to 3.0%, and more preferably in the range from 1.0 to 2.5%. Here, the reason for setting the lower limit to 1.0% is that it is already known by the study of the present inventor that where the compressive strain amount is less than 1%, the crystal quality of an adjacent layer on the active layer is rather improved when it is lattice-matched with the substrate. That is, where a strained quantum well layer has a compressive strain amount not less than 1.0%, the advantageous effects obtained by the present invention of adjacently forming a strain buffer layer on an active layer are effectively demonstrated. In the mean time, the reason for setting the upper limit to 3.0% is that a larger lattice constant than this causes the crystals to exceed the elastic limit and the buffering becomes impossible. Preferably, the layer thickness of highly strained quantum well layer 14 is in the range from 4 to 10 nm from the viewpoint of emission gain.

Active layer A1 is formed of highly strained quantum well layer 14. In this case, the strain amount of active layer A1 is 2.1%. The structure of active layer A1 is not necessarily limited to that described above, and may have a structure in which generally used barrier layers and strained quantum well layers are stacked alternately. Where a plurality of strained quantum well layers is provided, the layers generally have the same compressive strain amount and the value is used as the strain amount of active layer A1. If that is not the case, however, it is preferable that a maximum value of the strain amounts of the layers be used.

Strain buffer layer B1 includes second barrier layer 13b, second clad layer 12b and third clad layer 12c. Since the strain amount of active layer is 2.1%, each layer included in strain buffer layer B1 may be a layer having a compressive strain amount of not greater than 2.1%. Preferably, strain buffer layer B1 includes at least one layer selected from the group consisting of the barrier layer, light guide layer, and second clad layer, since addition of a new layer causes the manufacturing process steps of semiconductor light emitting device 10 to be increased and becomes costly.

Preferably, the layer thickness of each layer included in strain buffer layer B1 is in the range from 0.02 to 1 μm and the product of the compressive strain amount and layer thickness thereof is not less than 0.01%·μm from the viewpoint of effective reduction of lattice constant misfits between active layer A1 and strain buffer layer B1 and optimization of the crystal state. In the present embodiment, this condition is further applied to the compressive strain amounts of barrier layer 13b and second clad layer 12b. It is generally practiced to buffer the stress of strain in the active layer by fabricating the barrier layer so as to have a strain amount, but in this case, the layer thickness of the barrier layer is normally less than several tens of nanometers. In contrast, by ensuring a layer thickness to a certain degree for each layer included in strain buffer layer B1 as described above, the crystal strength may be improved.

Likewise, from the viewpoint of effective reduction of lattice constant misfits and optimization of the crystal state, it is preferable that sum S of the product of the compressive strain amount and layer thickness of each layer included in strain buffer layer B1, which is represented by Formula (1) above, satisfy Formula (2) above. The reason is that the use of a layer having a thicker layer thickness than another even they have the same compressive strain amount will result in increased crystal strength and better optimization of the crystal state as a whole, which produces better effects for the durability and reliability of semiconductor light emitting device 10. The results of an experiment conducted by the present inventor with sum S as the parameter shows that it is preferable that sum S be in the range from 0.02 to 0.2%·μm. In particular, it is known that a value greater than 0.2%·m causes crystal defects to be increased rapidly, which will lead to increased operating current when energized. Further, it is preferable that the compressive strain amount of each layer included in strain buffer layer B1 satisfy Formula (3) above in order to minimize lattice constant misfits.

An operation of semiconductor light emitting device 10 according to the present embodiment will now be described. In semiconductor light emitting device 10 according to the present embodiment, strain buffer layer B1 is adjacently formed on active layer A1. The strain buffer layer B1 includes barrier layer 13b having a compressive strain amount not greater than 2.1% which is the value corresponds to that of active layer A1 (compressive strain amount of 1.0%, layer thickness of 0.02 μm), second clad layer 12b (compressive strain amount of 0.5%, layer thickness of 0.04 μm), and third clad layer 12c (compressive strain amount of 0.2%, layer thickness of 0.5 μm). This reduces the misfits between active layer A1 and the adjacent layer on the active layer (strain buffer layer B1) in comparison with a conventional method in which an light guide layer or a clad layer lattice matched with the substrate is adjacently formed on the active layer having a strain amount, and the crystal quality of the adjacent layer on the active layer is improved. Therefore, spreading of crystal defects into the active layer arising from the crystal defects in the adjacent layer on the active layer is reduced, whereby the durability and reliability of the semiconductor light emitting device may be improved.

Further, in the present embodiment, sum S of Formula (1) above is calculated as 1.0%×0.02 μm (product of compressive strain amount and layer thickness of second barrier layer 13b)+0.5%×0.02 μm (product of compressive strain amount and layer thickness of second clad layer 12b)+0.2%×0.5 μm (product of compressive strain amount and layer thickness of third clad layer 12c)=0.14%·μm. This satisfies Formula (2) above so that the durability and reliability of semiconductor light emitting device 10 is further improved.

Further, where the compressive strain amounts of barrier layer 13b, second clad layer 12b, and third clad layer 12c are assumed to be $\Delta_{13b}$, $\Delta_{12b}$, and $\Delta_{12c}$ respectively, then $\Delta_{13b} \geq \Delta_{12b} \geq \Delta_{12c}$ which satisfies Formula (3) above. Therefore, in the relationships among four layers of active layer A1, barrier layer 13b, second clad layer 12b, and third clad layer 12c, the lattice constant misfits are minimized, whereby the durability and reliability of semiconductor light emitting device 10 may further be improved.

Still further, strain buffer layer B1 is formed of the existing barrier layer and clad layers, so that the conventional semiconductor light emitting device manufacturing process requires no additional step, and the durability and reliability of semiconductor light emitting device 10 may be improved only by changing the stacking condition of the materials.

In the present embodiment, each layer of semiconductor light emitting device 10 have a planar shape, but the shape of each layer of the semiconductor light emitting device according to the present invention is not limited to this and may have, for example, an inclined shape.

Further, the layer structure of semiconductor light emitting device 10 of the present embodiment may be applied to a semiconductor light emitting device with a refractive index guided structure, a semiconductor light emitting device with a diffraction grating, or an integrated optical circuit produced by ordinary photolithography or dry etching.

Second Embodiment

Figure 2D:
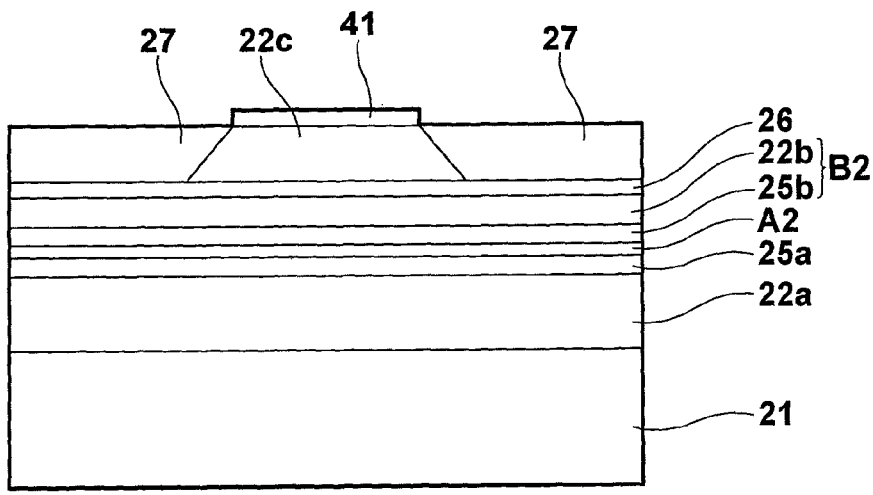
FIG. 2D is a cross-sectional view of the semiconductor light emitting device according to the second embodiment, illustrating the manufacturing process thereof (part 4).
Figure 2E:
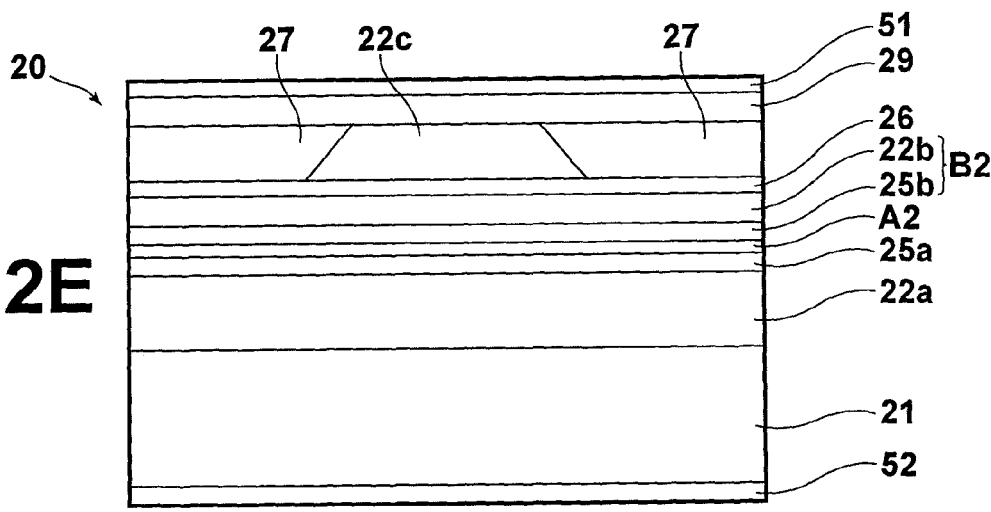
FIG. 2E is a cross-sectional view of the semiconductor light emitting device according to the second embodiment.

FIGS. 2A to 2E are schematic cross-sectional views of a semiconductor light emitting device according to a second embodiment, illustrating a manufacturing process thereof, in which FIG. 2E is a schematic cross-sectional view of the semiconductor light emitting device according to the second embodiment produced through the manufacturing process. The features of the present embodiment are that active layer A2 has a multiple quantum well structure in which three highly strained quantum well layers 24 (compressive strain amount of 1.0%, layer thickness of 4 nm) and two barrier layers 23 (lattice matched with substrate 21, layer thickness of 10 nm) are stacked alternately, and strain buffer layer B2 includes second light guide layer 25b (compressive strain amount of 0.5%, layer thickness of 0.04 µm) and second clad layer 22b (compressive strain amount of 0.2%, layer thickness of 0.1 µm). The structure of the semiconductor light emitting device of the second embodiment is substantially identical to that of the semiconductor light emitting device of the first embodiment other than active layer A2, strain buffer layer B2, and light guide layers 25a, 25b, so that identical structures will not elaborated upon further here unless otherwise required.

Hereinafter, the structure and manufacturing method of semiconductor light emitting device 20 will be described in detail with reference to the drawings. Semiconductor light emitting device 20 according to the present embodiment is manufactured in the following manner. First, the following layers are sequentially formed on n-GaAs substrate 21 by organometallic vapor phase epitaxy: n-AlGaInP first clad layer 22a (lattice matched with substrate 21, layer thickness of 1.5 µm); n- or i-AlGaInP first optical layer 25a (lattice matched with substrate 11, layer thickness of 0.05 µm); active layer A2 having a multiple quantum well structure in which three InGaP highly strained quantum well layers 24 (compressive strain amount of 1.0%, layer thickness of 4 nm) and two i-AlGaInP barrier layers 23 (lattice matched with substrate 21, layer thickness of 10 nm) are stacked alternately; i-AlGaInP second light guide layer 25b (compressive strain amount of 0.5%, layer thickness of 0.04 µm); p-AlGaInP second clad layer 22b (compressive strain amount of 0.2%, layer thickness of 0.1 µm); p-GaAs etching blocking layer 26 (layer thickness of 0.05 µm); and p-AlGaInP third clad layer 22c (lattice matched with substrate 21, layer thickness of 1.0 µm). Then, SiO$_2$ insulation layer 41 is formed on third clad layer 22c (FIG. 2A). Thereafter, insulation layer 41 is removed by ordinary photolithography with a stripe shaped portion thereof having a width of about 3 µm remained (FIG. 2B), and third clad layer 22c is removed to the upper surface of etching blocking layer 26 by wet etching with the remaining stripe shaped portion of insulation layer 41 as the mask to form a ridge stripe (FIG. 2C, use of hydrochloric acid etchant causes the etching to be automatically stopped at etching blocking layer 26). Then, n-GaAs current constriction layer 27 is selectively formed in the region where third clad layer 22c is removed by etching (on both sides of the ridge portion) (FIG. 2D). Then, the remaining insulation layer 41 is removed and p-GaAs contact layer 29 (layer thickness of 0.2 µm) is grown on the exposed upper surfaces of third clad layer 22c and current constriction layer 27. Thereafter, p-type electrode layer 51 is formed on the upper surface of contact layer 29 and n-type electrode layer 52 is formed on the rear surface of substrate 21 after grinding the rear surface. Finally, a high reflection coating is applied to one of the resonator faces formed by cleaving the sample layer structure and a low reflection coating is applied to the other face (FIG. 2E).

Light guide layers 25a, 25b may be formed by molecular beam epitaxy with a solid or a gas as the source or the like other than the organometallic vapor phase epitaxy. Likewise, the materials, compressive strain amount and layer thickness of each of the layers may be properly selected as required, and are not specifically limited to those described above.

An operation of semiconductor light emitting device 20 according to the present embodiment will now be described. In semiconductor light emitting device 20 according to the present embodiment, strain buffer layer B2 is adjacently formed on active layer A2. The strain buffer layer B2 includes second light guide layer 25b having a compressive strain amount not greater than 1.0% which corresponds to that of active layer A2 (compressive strain amount of 0.5%, layer thickness of 0.04 µm), and second clad layer 22b (compressive strain amount of 0.2%, layer thickness of 0.1 µm).

In the present embodiment, sum S of Formula (1) above is calculated as 0.5%×0.04 µm (product of compressive strain amount and layer thickness of second light guide layer 25b)+ 0.2%×0.1 µm (product of compressive strain amount and layer thickness of second clad layer 22b)=0.04%·µm.

Further, where the compressive strain amounts of second light guide layer 25b and second clad layer 22b are assumed to be $\Delta_{25b}$ and $\Delta_{22b}$ respectively, the relationship of $\Delta_{25b} \geq \Delta_{22b}$ is satisfied.

Accordingly, the present embodiment may provide advantageous effects identical to those of the first embodiment.

The structure described above allows generation of high optical power laser light, while maintaining single transverse mode, and may provide high reliability of more than 10,000 hours under high output operation of more than 100 mW.

Third Embodiment

Figure 3A:
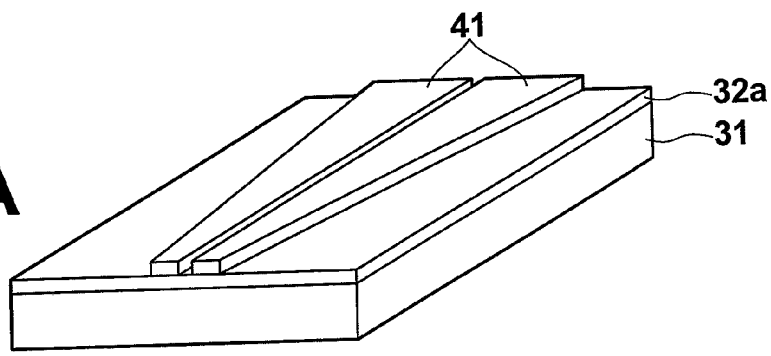
FIG. 3A is a cross-sectional view of a semiconductor light emitting device according to a third embodiment, illustrating a manufacturing process thereof (part 1).
Figure 3B:
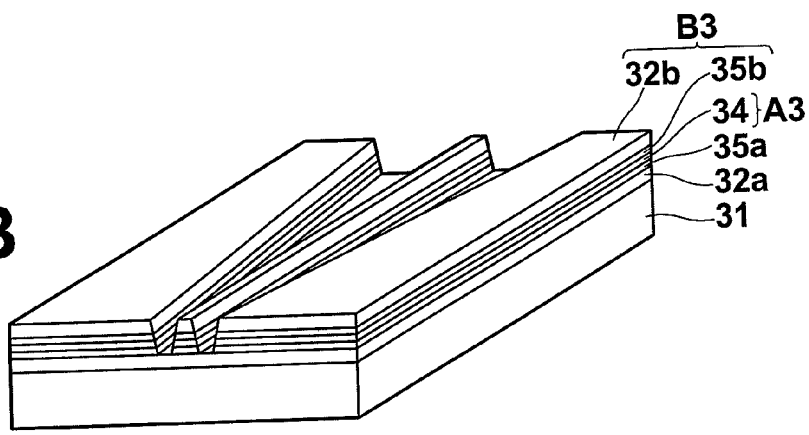
FIG. 3B is a cross-sectional view of the semiconductor light emitting device according to the third embodiment, illustrating the manufacturing process thereof (part 2).
Figure 3C:
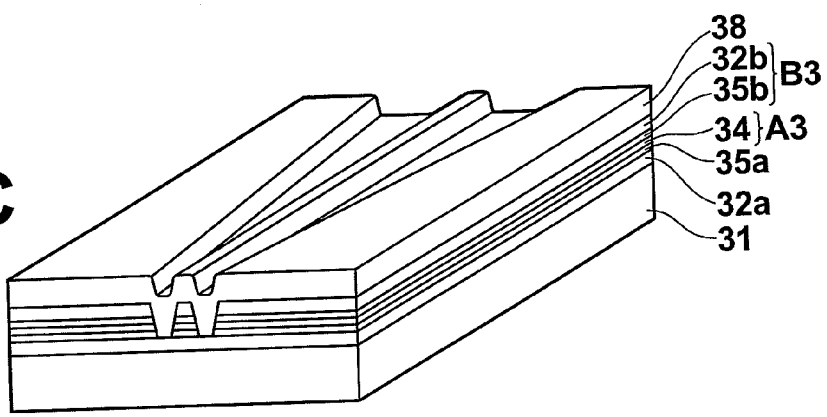
FIG. 3C is a cross-sectional view of the semiconductor light emitting device according to the third embodiment, illustrating the manufacturing process thereof (part 3).
Figure 3D:
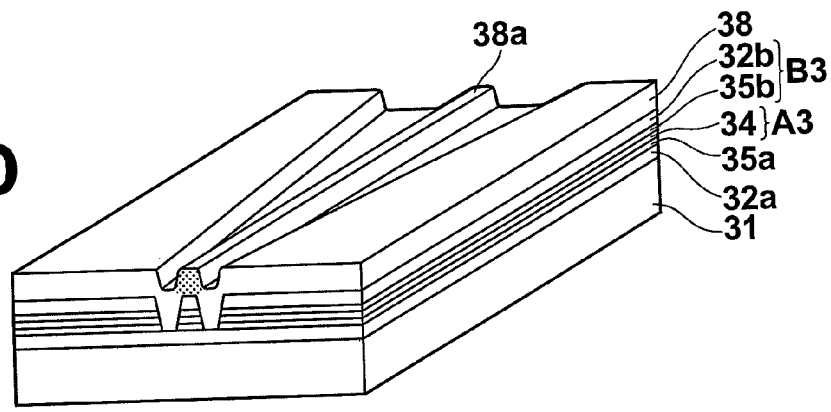
FIG. 3D is a cross-sectional view of the semiconductor light emitting device according to the third embodiment, illustrating the manufacturing process thereof (part 4).
Figure 3E:
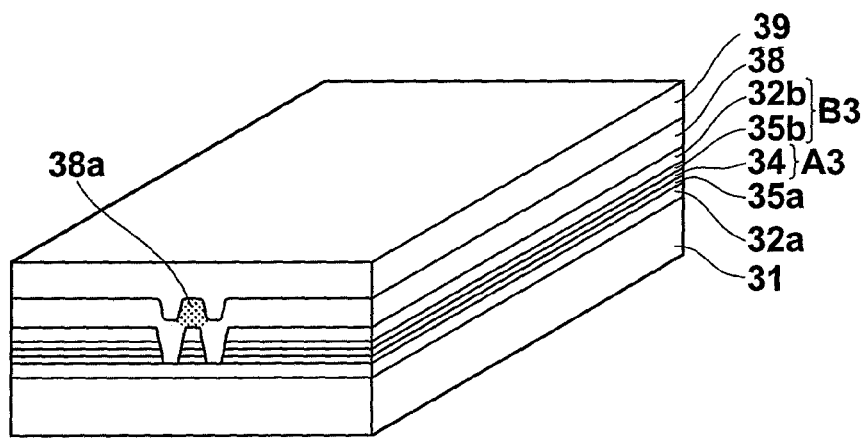
FIG. 3E is a cross-sectional view of the semiconductor light emitting device according to the third embodiment, illustrating the manufacturing process thereof (part 5).
Figure 3F:
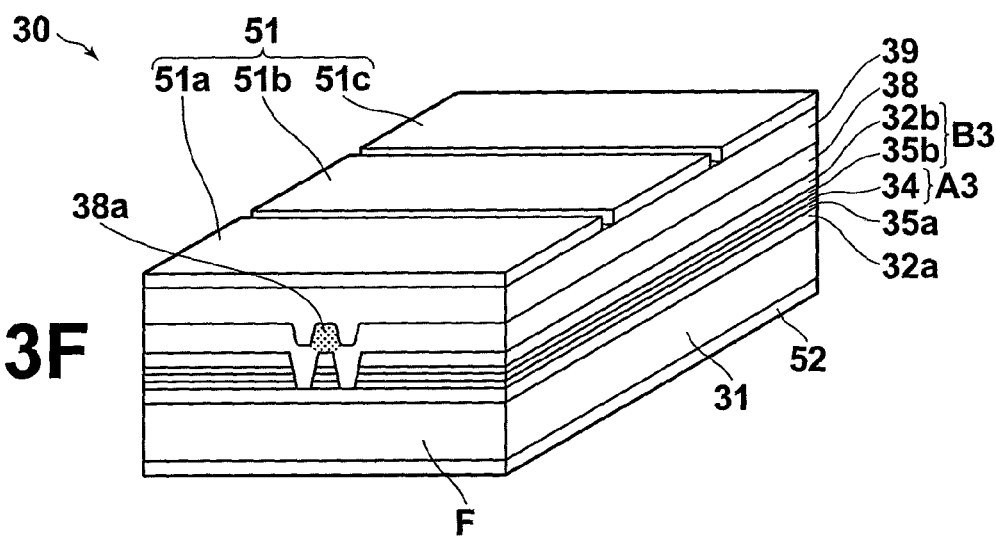
FIG. 3F is a perspective view of the semiconductor light emitting device according to the third embodiment.

FIGS. 3A to 3F are schematic cross-sectional views of a semiconductor light emitting device according to a third embodiment, illustrating a manufacturing process thereof, in which FIG. 3F is a perspective view of the semiconductor light emitting device according to the third embodiment produced through the manufacturing process. In semiconductor light emitting device 30 of the present embodiment, active layer A3 has a structure in which the gain wavelength changes continuously in the light guide direction and p-type electrode layer 51, which is the top layer of semiconductor light emitting device 30, is separated into three electrodes 51a, 51b, and 51c insulated from each other in the light guide direction. Separated electrodes 51a, 51b, and 51c are individually controllable for injection current.

The features of the present embodiment are that active layer A3 is formed of strained quantum well layer 34 (compressive strain amount of 1.5%, layer thickness of 4 nm), and strain buffer layer B3 is formed of second light guide layer 35b (compressive strain amount of 0.5%, layer thickness of 0.02 μm) and second clad layer 32b (compressive strain amount of 0.2%, layer thickness of 0.05 μm).

The third embodiment is essentially identical to the second embodiment other than the element structures described above, so that identical structures will not elaborated upon further here unless otherwise required.

Hereinafter, the structure and manufacturing method of semiconductor light emitting device 30 will be described in detail with reference to FIGS. 3A to 3F. n-InGaP first clad layer 32a (lattice matched with substrate 31, layer thickness of 1.5 μm) is formed on n-GaAs substrate 31, and then $SiO_2$ insulation layer 41 is formed thereon in a first crystal growth process. Then, insulation layer 41 is selectively patterned in a tapered shape (FIG. 3A). Thereafter, in a second crystal growth process, i-GaAs first light guide layer 35a (layer thickness of 0.1 μm), i-InGaAs highly strained quantum well layer 34 (compressive strain amount of 1.5%, layer thickness of 4 nm), i-InGaAsP second light guide layer 35b (compressive strain amount of 0.5%, layer thickness of 0.02 μm), and p-InGaP second clad layer 32b (compressive strain amount of 0.2%, layer thickness of 0.05 μm) are selectively grown with taper-shaped insulation layer 41 as the mask, and insulation layer 41 is removed (FIG. 3B). After insulation layer 41 is removed, in a third crystal growth process, n-InGaP block layer 38 (lattice matched with substrate 31, layer thickness of 1.0 μm) is formed on the entire surface (FIG. 3C). Thereafter, a p-type dopant is injected into portion 38a of block layer 38 located over the stripe-shaped active layer region by an ion implantation method, thereby changing stripe-shaped portion 38a of block layer 38 to p-type (FIG. 3D). Following this, in a fourth crystal growth process, p-GaAs contact layer 39 (layer thickness of 0.2 μm) is grown on the entire surface (FIG. 3E). Thereafter, p-type electrode layer 51 is formed on contact layer 39 and n-type electrode layer 52 is formed on the rear surface of substrate 31 (FIG. 3F). Where p-type electrode layer 51 is formed as three separate electrodes 51a, 51b, and 51c separated in the active layer stripe axis direction, as illustrated in FIG. 3F, they may be formed by providing masks at the separating sections before forming p-type electrode 51 or by forming a single electrode layer on the entire surface first and then removing the electrode layer at the separating sections.

The manufacturing method described above performs a selective growth using the taper-shaped mask (insulation layer 41) to utilize the behavior that the growth is faster at a portion adjacent to a wide portion of the taper-shaped mask (insulation layer 41) than at a portion adjacent to a narrow portion thereof. The utilization of this behavior allows active layer A3 having a thickness which varies gradually from front face F in the light guide direction toward the rear face in the stripe-shaped region sandwiched by the mask (insulation layer 41) to be formed.

An operation of semiconductor light emitting device 30 according to the present embodiment will now be described. In semiconductor light emitting device 30 according to the present embodiment, strain buffer layer B3 is adjacently formed on active layer A3. The strain buffer layer B3 includes second light guide layer 35b having a compressive strain amount not greater than 1.5% which corresponds to that of active layer A3 (compressive strain amount of 0.5%, layer thickness of 0.02 μm), and second clad layer 32b (compressive strain amount of 0.2%, layer thickness of 0.05 μm).

In the present embodiment, sum S of Formula (1) above is calculated as 0.5%×0.01 μm (product of compressive strain amount and layer thickness of second light guide layer 35b)+ 0.2%×0.05 μm (product of compressive strain amount and layer thickness of second clad layer 32b)=0.02%·μm.

Further, where the compressive strain amounts of second light guide layer 35b and second clad layer 32b are assumed to be $\Delta_{35b}$ and $\Delta_{32b}$ respectively, the relationship of $\Delta_{35b} \geq \Delta_{32b}$ is satisfied.

Accordingly, the present embodiment may provide advantageous effects identical to those of the first embodiment.

Further, it is known that when the thickness of active layer A3 is not constant as in the structure described above, the gain wavelength differs and a thinner portion of active layer A3 emits shorter wavelength light. That is, by gradually increasing the thickness from front face F, which is the output face, toward the rear face, semiconductor light emitting device 30 may be formed such that the front face F side becomes the shorter gain wavelength side. Thus, short wavelength light which is normally absorbed in a gain section of longer wavelength than the self-wavelength may be prevented from being absorbed in the guide path to front face F.

Semiconductor light emitting devices 10 to 30 are applicable as light sources in the fields of communication, measurement, medicine, printing, and image processing. In each of the embodiments described above, a semiconductor light emitting device that uses a GaAs substrate and outputs light with a wavelength in the wavelength range of 1 μm is described as an example, but the present invention is also applicable to a visible light semiconductor light emitting device using a GaN substrate, and the present invention is effective to any semiconductor light emitting device as long as it uses a highly strained quantum well layer having a large strain amount in the active layer.

What is claimed is:

1. A semiconductor light emitting device, comprising a conductive semiconductor substrate on which at least the following layers are stacked in the order listed below: a first clad layer; an active layer which includes at least one highly strained quantum well layer having a compressive strain amount not less than 1% with respect to the conductive semiconductor substrate; and a second clad layer,
   wherein the apparatus further comprises a strain buffer layer adjacently formed on the active layer and includes a layer having a compressive strain amount not greater than the strain amount of the active layer,
   wherein sum S of the product of the compressive strain amount and layer thickness of each layer included in the strain buffer layer represented by Formula (1) below satisfies Formula (2) below:

$$S = \Sigma(\Delta i \times Ti) \qquad (1)$$

$$0.2\%\cdot\mu m \geq S \geq 0.02\%\cdot\mu m \qquad (2)$$

where, $\Delta i$ and $Ti$ are the compressive strain amount (%) and layer thickness (μm) of $i^{th}$ layer of the strain buffer layer from the active layer side, and $\Sigma$ means to sum up the product in each layer included in the strain buffer layer.

2. A semiconductor light emitting device, comprising a conductive semiconductor substrate on which at least the following layers are stacked in the order listed below: a first clad layer; an active layer which includes at least one highly strained quantum well layer having a compressive strain amount not less than 1% with respect to the conductive semiconductor substrate; and a second clad layer, wherein the apparatus further comprises a strain buffer layer adjacently formed on the active layer and includes a layer having a compressive strain amount not greater than the strain amount of the active layer, wherein the compressive strain amount of each layer included in the strain buffer layer satisfies Formula (3) below:

$$\Delta 1 \geqq \Delta 2 \geqq \cdots \Delta i \geqq \cdots \geqq \Delta n \qquad (3)$$

where, $\Delta i$ is the compressive strain amount of $i^{th}$ layer of the strain buffer layer from the active layer side, and n is the total number of layers included in the strain buffer layer.

3. The semiconductor light emitting device as claimed in claim 1, wherein the compressive strain amount of each layer included in the strain buffer layer satisfies Formula (3) below:

$$\Delta 1 \geqq \Delta 2 \geqq \cdots \geqq \Delta i \geqq \cdots \geqq \Delta n \qquad (3)$$

where, $\Delta i$ is the compressive strain amount of $i^{th}$ layer of the strain buffer layer from the active layer side, and n is the total number of layers included in the strain buffer layer.

4. A semiconductor light emitting device, comprising a conductive semiconductor substrate on which at least the following layers are stacked in the order listed below: a first clad layer; an active layer which includes at least one highly strained quantum well layer having a compressive strain amount not less than 1% with respect to the conductive semiconductor substrate; and a second clad layer, wherein the apparatus further comprises a strain buffer layer adjacently formed on the active layer and includes a layer having a compressive strain amount not greater than the strain amount of the active layer, wherein the layer thickness of each layer included in the strain buffer layer is in the range from 0.02 to 1 μm.

5. The semiconductor light emitting device as claimed in claim 1, wherein the layer thickness of each layer included in the strain buffer layer is in the range from 0.02 to 1 μm.

6. The semiconductor light emitting device as claimed in claim 2, wherein the layer thickness of each layer included in the strain buffer layer is in the range from 0.02 to 1 μm.

7. A semiconductor light emitting device, comprising a conductive semiconductor substrate on which at least the following layers are stacked in the order listed below: a first clad layer; an active layer which includes at least one highly strained quantum well layer having a compressive strain amount not less than 1% with respect to the conductive semiconductor substrate; and a second clad layer, wherein the apparatus further comprises a strain buffer layer adjacently formed on the active layer and includes a layer having a compressive strain amount not greater than the strain amount of the active layer, wherein the product of the compressive strain amount and layer thickness of each layer included in the strain buffer layer is not less than 0.01%·μm.

8. The semiconductor light emitting device as claimed in claim 1, wherein the product of the compressive strain amount and layer thickness of each layer included in the strain buffer layer is not less than 0.01%·μm.

9. The semiconductor light emitting device as claimed in claim 3, wherein the product of the compressive strain amount and layer thickness of each layer included in the strain buffer layer is not less than 0.01%·μm.

10. The semiconductor light emitting device as claimed in claim 3, wherein the product of the compressive strain amount and layer thickness of each layer included in the strain buffer layer is not less than 0.01%·μm.

* * * * *